United States Patent [19]

Pierce et al.

[11] Patent Number: 4,619,844
[45] Date of Patent: Oct. 28, 1986

[54] METHOD AND APPARATUS FOR LOW PRESSURE CHEMICAL VAPOR DEPOSITION

[75] Inventors: John M. Pierce, Palo Alto; William I. Lehrer, Los Altos, both of Calif.

[73] Assignee: Fairchild Camera Instrument Corp., Mountain View, Calif.

[21] Appl. No.: 693,401

[22] Filed: Jan. 22, 1985

[51] Int. Cl.$^4$ .................. C23C 16/00; B05C 11/00
[52] U.S. Cl. .................. 427/248.1; 118/663; 118/688; 118/692; 118/719; 118/725; 118/726
[58] Field of Search .................. 427/248.1, 263; 118/663, 688, 692, 719, 725, 726

[56] References Cited

U.S. PATENT DOCUMENTS

| | | | |
|---|---|---|---|
| 3,666,553 | 5/1972 | Arthur et al. | 427/248.1 |
| 4,152,478 | 5/1979 | Takagi | 427/248.1 |
| 4,167,915 | 9/1979 | Toole et al. | 118/692 |
| 4,395,440 | 7/1983 | Abe et al. | 118/719 |
| 4,438,153 | 3/1984 | Pinkhason | 118/726 |
| 4,484,943 | 11/1984 | Miura et al. | 118/726 |
| 4,516,527 | 5/1985 | Sugioka | 118/726 |

Primary Examiner—Sadie L. Childs
Attorney, Agent, or Firm—Carl L. Silverman; David H. Carroll; William H. Murray

[57] ABSTRACT

A method of introducing a controlled flow of vapor from a high pressure sublimation chamber into a low pressure vapor deposition reactor, said vapor being derived from solid source material preferably, but not necessarily, having a vapor pressure above about one (1) Torr at a temperature not exceeding about 350° C. The method comprises controllably heating the source material to a temperature sufficient to produce vapor therefrom at a desired pressure, and then controllably transferring the vapor through vapor transmission means to the vapor deposition reactor. During such transfer, the transmission means is maintained at a temperature sufficient to prevent condensation of the vapor therein during transfer. The vapor is delivered to the reactor in a pure state and is not mixed with any carrier medium.

16 Claims, 1 Drawing Figure

METHOD AND APPARATUS FOR LOW PRESSURE CHEMICAL VAPOR DEPOSITION

BACKGROUND OF THE INVENTION

This invention relates to deposition of materials and more particularly to a method and apparatus for introducing a controlled flow of vapor from a vapor source into a low pressure chemical vapor deposition reactor.

The deposition of thin films from vapor sources is a precision operation requiring controlled and precise introduction of a reactive gas or gases into a reaction chamber. The transmission of this vapor from its source to the reaction chamber generally has required a series of procedures. First of all, the source material from which the vapor is derived is heated to its sublimation temperature. This is generally performed within a sublimation chamber as known in the art. Secondly, the vapor so produced then must be mixed with a carrier gas for transport to the reaction chamber. Finally, the vapor and carrier gas mixture, maintained at relatively high pressure, must be introduced into the low pressure reaction chamber. The attendant gas carrier must be disposed of, and the vapor deposition process then occurs. Among other deficiencies, this method suffers from the problem of heat transfer through several interfaces and relying on the temperature being constant. While it is operative with liquid sources which generally have good thermal transfer characteristics, solid sources, particularly in powder form, have thermal gradients which are too large to allow any precision of material transfer.

As is evident from the above discussion, a need exists for more effective and direct methodology in the production and delivery of vapor to a low pressure deposition reactor. It is therefore an object of the instant invention to produce vapor from a source material in a controlled manner yielding controlled pressure. It is likewise an object of this invention to controllably transfer the vapor so produced into the vapor deposition reactor in a controlled manner via transmission means. It is a further object of this invention to maintain the vapor in that state without condensation thereof during transfer to the reactor. Yet another object of the invention is to transfer and deliver this vapor in a pure state and not mixed with any carrier medium. These and other objects will become apparent in the text which follows.

SUMMARY OF THE INVENTION

The subject of the instant invention concerns a method and apparatus for introducing a controlled flow of vapor from a high pressure sublimation chamber into a low pressure vapor deposition reactor, said vapor being derived from solid source material preferably, but not necessarily, having a vapor pressure above about one (1) Torr at a temperature not exceeding about 350°C. Said source material can be chosen from any solid material exhibiting appreciable vapor pressure within the temperature constraints of apparatus employed. The singular restriction on the source material itself is that it sublines at a temperature which is lower than its decomposition temperature.

The method comprises controllably heating the source material in the sublimation chamber to a temperature sufficient to produce vapor therefrom at a desired pressure, and then controllably transferring the vapor through vapor transmission means to the vapor deposition reactor. During such transfer, the transmission means is maintained at a temperature sufficient to prevent condensation of the vapor therein during transfer. By controllably heating the source material, of course, the pressure of the vapor over the source material can be controlled. Likewise, by controllably transferring, as by valves and orifices, for example, the vapor thus formed, the mass of vapor flow into the reactor can be controlled. By controlling vapor pressure, a pressure difference is established between the chamber and reactor regardless of temperature. Controlling and monitoring such pressure permits a precise amount of material to be transferred per unit of time and is highly reproducible. Thus, temperature is controlled only to maintain a given vapor pressure, therefore being controlled only as a function of said pressure. Fixation of the size of an orifice through which vapor flows from the chamber to the vapor deposition reactor also fixes the pressure difference there between. Therefore, maintaining a given pressure within the chamber results in a precise quantity of material being transferred to the reactor.

In a preferred apparatus, the solid source material is placed within a heat controllable pressure sublimation chamber which is disposed within a heat controllable second chamber. A valve-openable vapor transmission line is in communication at one end thereof with the sublimation chamber and at the other end thereof with the reactor situated outside the second chamber. The source material is heated within the sublimation chamber and the temperature within the second chamber is maintained at a higher value than that of the sublimation chamber. Such higher temperature prevents condensation of the vapor in the portion of the transmission line disposed within the second chamber. Controlled opening of the transmission line, of course, permits travel of vapor therethrough to the reactor. The temperature throughout the length of the transmission line must be high enough to prevent condensation of vapor therein. Consequently, depending on the proximity of the reactor to the outside of the second chamber, additional heating means may be required for the transmission line over the distance between the second chamber and the reactor.

DETAILED DESCRIPTION OF A PREFERRED EMBODIMENT

Figure 1:
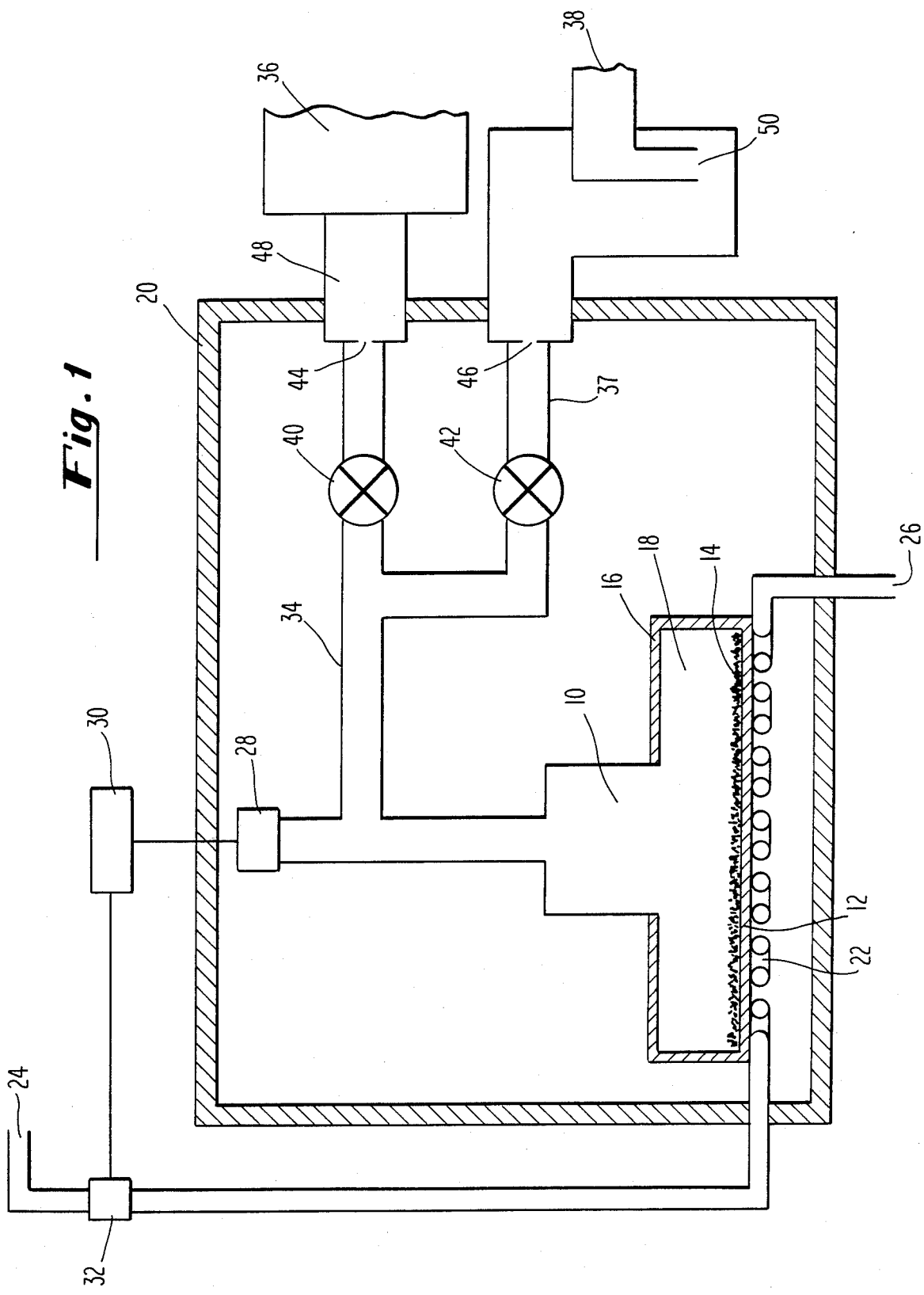
FIG. 1 is a diagrammatic cross-section view of a vapor production and delivery apparatus.

Referring to FIG. 1, a vapor production and delivery apparatus is shown to illustrate one manner in which the instant invention can be practiced. It is to be understood that the apparatus so shown is not meant to be limiting as to the scope of the invention.

The vapor production and delivery apparatus comprises a sublimation pressure chamber 10 having an expansive bottom 12 on which a thin layer of source material 14, for example $TaCl_5$ is spread. The chamber 10 includes a lower section 16 which is constructed of a material having good thermal conduction properties in order to provide an isothermal region 18. Other means for enhancing heat transfer, such as internal vanes or fins, could also be used. The sublimation chamber 10 is contained within an oven 20 which is preferably maintained at a temperature of about 10° to 15° C. higher than the temperature of the sublimation chamber 10.

The temperature of the sublimation chamber 10 is controlled by regulating flow of a cooling gas such as nitrogen through cooling coils 22 situated beneath the bottom 12 of the sublimation chamber 10.

Construction of the cooling means is that as generally known in the art, and includes an inlet 24 leading from a cooling gas supply (not shown), and a cooling gas outlet 26 which preferably directs the cooling gas to a closed loop for reuse. The apparatus is preferably equipped with a pressure sensor 28 for measuring vapor pressure within the sublimation chamber 10 and generating a signal representative of the measured pressure. In conjunction therewith, a signal converter 30 receives the signal from the pressure sensor and applies a control signal to a flow controller 32. The flow controller 32 controls the flow of cooling gas from a supply (not shown) to the cooling coils 22 in response to the signal applied from the signal converter 30.

A vapor transmission line 34 is in communication at one end thereof with the sublimation chamber 10 and at the other end thereof with a vapor deposition reactor 36 situated outside of the oven 20. The vapor transmission line 34 has a branch 37 which leads to an auxiliary vacuum pump located outside of the oven 20 through an outlet 38. Valves 40 and 42 can control flow as desired. Maintenance of the temperature of the oven 20 at 10° to 15° C. above that of the chamber 10 ensures no condensation of vapor within the transmission line 34 or branch 37 at sites within said oven 20.

In operation, vapor produced in the sublimation chamber 10 at a controlled pressure is delivered to one of two identical orifices 44, 46 through two valves 40 and 42 respectively. One path leads through a heated tube 48, preferably 10° to 15° C. above the temperature of the chamber 10, surrounding the portion of the transmission line 34 situated outside of the oven 20, to the reactor 36. The heated tube 48 is maintained at a temperature sufficient to prevent condensation of vapor therein. Such tube construction can be any as known in the art as, for example, thermal tape applied to the external wall of said tube. The other path leads through a cold trap 50 to the auxiliary vacuum pump through outlet 38. The secondary outlet through the orifices 46 is used to set up the system at the flow rate to be used for a deposition. These orifices are chosen to set a difference between the vapor pressure in the sublimation chamber 10 and the pressure in the reactor 36. The size of the orifices obviously depend on the vapor pressure of the material being sublimated at the temperature being used. At the proper time valve 42 is closed and valve 40 is opened to direct the flow into the reactor 36. In this way the proper vapor flow rate is established in minimum time. As is evident, the instant invention provides a controlled flow of pure vapor, thus requiring no carrier gas to transport the vapor into the reactor. Resultant uniformity and repeatability of deposition rates of 5%± have been achieved.

It is to be understood that the above description of a preferred embodiment is illustrative and not limiting, and that the scope of the invention is now defined in the claims which follow.

What is claimed is:

1. A method of introducing a controlled flow of vapor from a high pressure sublimation chamber into a low pressure vapor deposition reactor, said vapor being derived from solid source material having a vapor pressure above about one (1) Torr at a temperature not exceeding about 350° C., said method comprising:

(a) heating the source material in the sublimation chamber to a temperature sufficient to produce vapor therefrom at a desired pressure;
    (b) transferring said vapor to said reactor through a valved orifice of vapor transmission means, at which orifice, the pressure of the vapor can be substantially reduced to produce a controllable flow of vapor nearly proportional to the pressure in the sublimation chamber; and
    (c) maintaining said vapor transmission means at a temperature sufficient to prevent condensation of the vapor therein during transfer.

2. The method of claim 1 wherein step (a) further comprises placing said source material within a heat controllable sublimation chamber disposed within a heat controllable second chamber, said sublimation chamber having vapor transmission means comprising a vapor transmission line in communication therewith and extending therefrom through the second chamber to terminate at a site outside the second chamber and in communication with the reactor there disposed.

3. The method of claim 1 wherein the transmission means leading to the reactor has a branch thereof leading to the outside, with the transmission means and the branch each having independently openable valve means.

4. The method of claim 3 wherein the branch leads to a vacuum pump.

5. The method of claim 1, 2, or 3 wherein the temperature of the transmission means is maintained about 10° to 15° C. higher than the temperature of the sublimation chamber.

6. A method of introducing a controlled flow of vapor from a high pressure sublimation chamber into a low pressure vapor deposition reactor, said vapor being derived from solid source material, said method comprising the steps of:

(a) heating the source material in the sublimation chamber to a temperature sufficient to produce vapor therefrom at a desired pressure;
    (b) transferring said vapor to said reactor through a valved orifice of vapor transmission means, at which orifice the pressure of the vapor can be substantially reduced to produce a controllable flow of vapor nearly proportional to the pressure in the sublimation chamber; and
    (c) maintaining said vapor transmission means at a temperature sufficient to prevent condensation of the vapor therein during transfer.

7. The method of claim 6 wherein step (a) further comprises placing said source material within a heat controllable sublimation chamber disposed within a heat controllable second chamber, said sublimation chamber having vapor transmission means comprising a vapor transmission line communication therewith and extending therefrom through the second chamber to terminate at a site outside the second chamber and in communication with the reactor there disposed.

8. The method of claim 7 wherein the transmission means leading to the reactor has a branch thereof leading to the outside, with the transmission means and the branch each having independently openable valve means.

9. The method of claim 8 wherein the branch leads to a vacuum pump.

10. The method of claim 6, 7, or 8 wherein the temperature of the transmission means is maintained about 10° to 15° C. higher than the temperature of the sublimation chamber.

11. A vapor production apparatus comprising a high pressure sublimation chamber disposed within a second chamber, each of said chambers having independent temperature control means and wherein the sublimation chamber has in communication therewith vapor transmission means leading to a site outside the second chamber, said vapor transmission means including a valved orifice.

12. The apparatus according to claim 11 having in addition a vapor deposition reactor outside the second chamber and in communication with the vapor transmission means.

13. The apparatus according to claim 12 wherein the transmission means has a branch thereof leading to a site outside the second chamber.

14. The apparatus according to claim 13 wherein the branch has a valved orifice.

15. The apparatus according to claim 11 or 14 wherein the walls of the pressure chamber are thermally conductive and wherein the heat control means of said chamber comprises a plurality of thermally conductive coils adjacent said chamber, said coils being capable of carrying therein a fluid.

16. The apparatus according to claim 15 having in addition:
(a) pressure sensor means which measures pressure within the sublimation chamber, said sensor means having means to generate a signal representative of measured pressure;
(b) flow controller means which controls fluid flow within the coils according to the value of a control signal; and
(c) signal converter means which receives the pressure signal from the pressure sensor means and applies a control signal to the flow controller means.

* * * * *